United States Patent [19]

Yokoyama et al.

[11] Patent Number: 5,081,070
[45] Date of Patent: Jan. 14, 1992

[54] SUPERCONDUCTING CIRCUIT BOARD AND PASTE ADOPTED THEREFOR

[75] Inventors: Hiromitsu Yokoyama, Sagamihara; Yoshihiko Imanaka, Atsugi; Kazunori Yamanaka, Sagamihara; Nobuo Kamehara, Isehara; Koichi Niwa, Tama; Takuya Uzumaki, Kawasaki; Hitoshi Suzuki, Zama; Takato Machi, Atsugi, all of Japan

[73] Assignee: Fujitsu Limited, Kawasaki, Japan

[21] Appl. No.: 268,195

[22] Filed: Jan. 30, 1989

Related U.S. Application Data

[62] Division of Ser. No. 191,157, May 6, 1988, abandoned.

[30] Foreign Application Priority Data

May 8, 1987 [JP] Japan ................. 62-110718

[51] Int. Cl.⁵ ................................. B32B 9/00
[52] U.S. Cl. ......................... 505/1; 505/701; 505/702; 505/703; 505/704; 428/209; 428/210; 428/426; 428/432; 428/433; 428/688; 428/901; 428/930; 361/397; 174/250
[58] Field of Search ............... 505/1, 701-704; 428/209, 210, 426, 432, 433, 688, 901, 930; 361/397; 174/68.5

[56] References Cited

U.S. PATENT DOCUMENTS 4,835,039  5/1989  Barringer et al. ........... 428/209

FOREIGN PATENT DOCUMENTS 0292125  11/1988  European Pat. Off. .

OTHER PUBLICATIONS

CA 110 (26); 241227z Imanaka et al., SC glass ceramics glass composite Fujitsu 5-11-87.
Jap. Abs. No. 89-120089, Manf. of SC Circuit Board, Hitachi Chem. 5-12-89.
New Electronics, vol. 20, No. 10, May 12, 1987, "Superconductor Future Heats Up", by P. Judge, p. 30.

Primary Examiner—Patrick J. Ryan
Attorney, Agent, or Firm—Staas & Halsey

[57] ABSTRACT

A superconducting circuit board is provided comprising a sintered alumina board containing more than 99% by weight of alumina and an interconnection pattern of an superconducting ceramics formed on the alumina board. Adhesion of the interconnection pattern to the alumina board is improved by an addition of Ti or Si coupling agent to a paste for forming the interconnection pattern. The use of copper powder in place of copper oxide powder as an ingredient forming a superconducting ceramics in the paste is advantageous for printing and obtaining a uniform superconducting ceramic pattern.

14 Claims, 11 Drawing Sheets

K: $Ba_{0.6} Y_{0.4} CuO\delta$

A·H: $(Y_{0.6} Ba_{0.4})_2 CuO\delta$

W: $Ba_2 Y Cu_3 O\delta$

U: $(Ba_{1-x} Sr_x)_8 Y_2 Cu_{10} O\delta$

Fig. 14A x = 0.125 : $(Sr_{0.125} Ba_{0.875})_8 Y_2 Cu_{10}O_\delta$

Fig. 14B x = 0.5 : $(Sr_{0.5} Ba_{0.5})_8 Y_2 Cu_{10}O_\delta$

Fig. 15A

Cu paste

Fig. 15B

CuO paste

Fig. 16

SUPERCONDUCTING CIRCUIT BOARD AND PASTE ADOPTED THEREFOR

This is a divisional of co-pending application Ser. No. 191,157 filed on May 6, 1988, now abandoned.

BACKGROUND OF THE INVENTION

1. Field of the Invention

The present invention relates to a superconducting circuit board and a paste adopted for forming a superconducting ceramic pattern on a ceramic board. Such a superconducting circuit board is useful for a 7 high speed computer such as a supercomputer.

2. Description of the Related Art

The insulating material used for a circuit board for high speed processing must have a low dielectric constant and the conducting material used must have a low electrical resistance, to ensure an efficient transmission of electrical signals. In the prior art, as such a circuit board, a multilayer ceramic circuit board is formed in which copper is used as the conducting material.

Recently, superconducting ceramics such as La-Ba-Cu-0 system, La-Sr-Cu-0 system, and Y-Ba-Cu-0 system which exhibit a superconductivity at the temperature of liquid nitrogen (77 K). have attracted attention and investigations into and developments of such materials are proceeding rapidly. To attain a superconducting circuit substrate, it is essential to develop a technique by which a superconducting ceramic paste can be printed on a ceramic board, such as an alumina board used in a hybrid IC, and fired to form an interconnection pattern of a superconductor.

Ceramic boards, including an alumina board, used for a circuit board, generally but except for a complete crystal monolith, have a structure comprising crystal grains, grain boundaries, also called a glass phase, and pores, and the higher the content of the glass phase, i.e., the lower the purity of the ceramic board, the lower the temperature at which the ceramic board can be fired or sintered. As a result, ceramic boards are generally manufactured by adding, to a ceramic, ingredients for a glass phase and able to be fired at about 1500° C. The ingredients for a glass phase are added to lower the firing temperature.

It was found that a fired, compacted body of a superconducting ceramics exhibits superconductivity, but if a pattern of a superconducting ceramic paste on an alumina board is fired to obtain a superconducting ceramic pattern, the resultant fired pattern does not exhibit superconductivity.

Thus, the object of the present invention is to provide a superconducting ceramic film on a ceramic board.

SUMMARY OF THE INVENTION

The above and other objects of the invention are attained by providing a superconducting circuit board comprising: a sintered alumina board containing more then 99% by weight of alumina; and a superconducting ceramic pattern formed on the alumina board.

The inventors found that a superconducting ceramics does not exhibit superconductivity after it is printed on a commercially sold alumina board as a paste thereof and is fired, because of a reaction of the superconducting ceramics with vitrious ingredients and amorphous $SiO_2$ and $B_2O_3$ contained as impurities in the alumina board. This reaction results in a deviation of the composition of the superconducting ceramics, causing a loss of superconductivity. The inventors also found that, by using a high purity alumina board containing more than 99% by weight alumina, i.e., less than 1% by weight of impurities, a superconducting ceramic film or pattern can be obtained on the alumina board by printing a superconducting ceramic paste thereon and firing same.

The alumina content of an alumina board used in the present invention should be more than 99% by weight, preferably more than 99.5% by weight, more preferably more than 99.7% by weight. Preferably, the impurities or ingredients other than alumina involves a smaller amount of vitrious ingredients or amorphous $SiO_2$ $B_2O_3$, etc. More preferably, an alumina board is made by firing a high purity alumina with a small amount, e.g., about 0.3% by weight, of a sintering agent such as MgO and $Cr_2O_3$; namely, a dense and pure sintered alumina board is more preferable. The process for manufacturing such a dense and pure sintered alumina board is described in ore detail in Examined Japanese Patent Publication (Kokoku) No. 55-11483, the disclosure of which is included herewith by reference.

The superconducting ceramics used in the present invention may be, for example, a superconducting oxide represented by the general formula:

$$A_{0.5-1.8} R_{0.2-2} M O_{2-5}$$

where A stands for at least one element selected from the group consisting of Ba, Sr, Ca and Mg; R stands for at least one element selected from the group consisting of Sc, Y, La, Ce, Pr, Nd, Sm, Eu, Gd, Tb, Dy, Ho, Er, Tm, Yb and Lu; M stands for at least one metal selected from the group of copper, silver and gold; and O stands for oxygen.

The superconducting ceramics may also be bismuth-system (Bi-Sr-Ca-Cu-0 or Tl-Bi, Sr-Ca-Cu-O system) superconducting ceramics. The exact chemical formula of the bismuth-system superconducting ceramic material is not known but can be formed from a starting material of a mixture of Bi, Sr, Ca, and Cu compounds in a molar ratio (based on these elements) of 0.25-2:0.1-5:0.5-4. For example, 1:1:1:2; 1:1:1:3, 4:3:3:6; and 4:3:3:4. Further, another superconducting ceramic material can be formed from a starting material of a mixture of Tl, Bi, Sr, Ca, and Cu compounds in a molar ratio · based on these elements) of 0.25-2:0.25-2:0.1-5:0.1-5:0.5-4. These superconducting ceramic materials exhibit superconductivity above the boiling point of the nitrogen (77K.)

To form a pattern of a superconducting ceramics on an alumina board, a paste is used comprising a superconducting ceramic powder with a vehicle such as an organic binder and a solvent. A typical composition of the paste is 100 parts by weight of the superconducting ceramic powder, 0.5 to 10 parts by weight, preferably 3 to 7 parts by weight, of the organic binder, and 5 to 30 parts by weight, preferably 7 to 9 parts by weight, of the solvent. If the amount of the organic binder is less than 0.5 part by weight, the ceramic powder is not sufficiently bound. If the amount of the organic binder is more than 10 parts by weight, it is difficult to maintain the shape of the paste pattern after drying. If the amount of the solvent, more specifically a non-volatile solvent, is less than 5% by weight, the viscosity of the paste is too high and it cannot be used for printing. If the amount of the non-volitile solvent is more than 30% by weight, the viscosity of the paste is too low for printing. When preparing a paste, a volatile solvent should be added in an amount of 10 to 30 parts by weight to 100 parts by weight of the superconducting ceramic powder, although the volatile solvent will be finally lost from the paste prepared for printing. If the amount of the volatile solvent is less than 10 parts by weight, it is difficult to uniformly disperse the ceramic powders, and the amount of the volatile solvent is more than 30 parts by weight, the time for preparation of the paste becomes undesirably long.

The superconducting ceramic powder in the paste may be replaced by powders of ingredients which can form a superconducting ceramic material by firing. For example, to form $Ba_2YCu_3O_\delta$, a combination of $BaCO_3$, $Y_2O_3$ and $CuO$ may be used. The form of the ingredients may be, for example, oxide, carbonate, hydroxide, metal, etc.

The paste preferably further contains at least one of titanium and silane coupling agents to improve adhesion of the superconducting ceramic pattern with the alumina base, and if any, an insulating layer to be formed over or under the superconducting ceramic pattern. The content of the titanium or silane coupling agent is generally from 0.1 to 10 parts by weight, preferably from 0.4 to 1.0 parts by weight, to 100 parts by weight of the superconducting ceramic material. If the amount of the coupling agent is less than 0.1 part by weight, an improvement of the adhesion can not be realized. If the amount of the coupling agent is higher than 10 parts by weight, the viscosity of the paste becomes extremely high, which necessitates the addition of an excess amount of a solvent to reduce that viscosity, causing difficulty in maintaining the shape of a printed paste pattern. In addition, if the amount of the coupling agent is outside the above range, the efficiency of yield of a superconducting ceramic pattern is reduced.

It is also preferably that the superconducting ceramics to be formed from the paste by firing is a superconducting complex oxide containing copper and the paste contains ingredients for forming the superconducting complex oxide by firing, which ingredients include a metal copper powder to constitute the complex oxide after firing. This metal copper powder has ductility, and thus improves the printing characteristics of the paste. The metal copper has a high diffusion coefficient in a superconducting complex oxide, which allows the formation of a uniform composition of a fired paste pattern. For example, in an experiment, when copper oxide was used in a paste for forming a superconducting complex oxide and a line pattern of the paste was printed and fired, pattern width of at least about 200 $\mu m$ was necessary to obtain a line pattern exhibiting superconductivity on a pure alumina board. In contrast, even with a line pattern width of 150 $\mu m$ or 100 $\mu m$, a line pattern exhibiting superconductivity was obtained on a pure alumina board when metal copper powder was substituted for the copper oxide in the paste. The resultant superconducting line pattern had a width having a deviation of less than 10% of the original printed pattern width.

The improvement of the printing characteristics of a paste by an addition of a metal copper powder is also obtained when the metal copper powder is supplementally added to a superconducting ceramic paste. In this case, it is not necessary that the paste is a copper-containing superconducting ceramics. The paste also may comprise a powder of an already superconducting ceramics, and not ingredients which form a superconducting ceramics by firing. In these cases, i.e., when a copper powder is supplementally added, the fired pattern contains copper oxide in addition to a superconducting ceramics, but the fired pattern exhibits superconductivity as a line. This supplemental metal copper powder may be added in an amount of 2 to 15 parts by weight, preferably 5 to 10 by weight, based on 100 parts by weight of a superconducting ceramic powder or superconducting ceramic-forming powders.

In an embodiment, the superconducting ceramics may be a superconducting complex oxide represented by the general formula:

$$\{(M^{II}O)_x(M_2^{III}O_3)_{1-x}\}_y(CuO)_z(O)_\delta$$

where $M^{II}$ stands for at least one element selected from the group of Ba, Sr, Ca and Mg; $M^{III}$ stands for at least one element selected from the group of Y, Sc, La, Ce, Pr, Nd, Sm, Eu, Gd, Tb, Dy, Ho, Er, Tm, Yb and Lu; $0.5 \leq x \leq 0.9$; $1 \leq y \leq 2$; $1 \leq z \leq 2$; $\delta$ stands for a deviation of the amount of oxygen from the stoichiometric amount thereof.

In a particular embodiment, the superconducting ceramics is represented by the formula: $\{(Sr_uBa_{1-u}O)_x(Y_2O_3)_{1-x}\}_y(CuO)_z(O)\delta$ where x, y, z and $\delta$ are as defined above and $0 < u < 1$. That is, this superconducting ceramics is a Ba-Y-Cu-O system superconductor in which Ba is partially replaced by Sr. In an experiment, it was found that the partial replacement of Ba with Sr makes the superconductor material denser and the superconducting transfer temperature $T_{co}$ lower, but at around u=0.5, the $T_{co}$ is becomes higher. Therefore, a Sr-substituted Ba-Y-Cu-O system superconductor in which about half of Ba is substituted with Sr is preferable because of a high density and a high $T_{co}$, more specifically, $0.4 \leq u \leq 0.6$ is preferred.

The superconducting ceramic pattern on the alumina board may have a multilayer structure. That is, after a superconducting ceramic pattern is formed on an aluminum board, an insulating layer may be formed over the superconducting ceramic pattern and another superconducting ceramic pattern formed on the insulating layer. The number of layers of the superconducting ceramic patterns is not limited.

DESCRIPTION OF THE PREFERRED EMBODIMENTS

The present invention is further described by way of Examples.

EXAMPLE 1

(Pure Alumina Board)

0.6 mol of $BaCO_3$ powder having an average particle size of 1 μm, 0.4 mol of $Y_2O_3$ powder having an average particle size of about 1 μm, and 1 mol of CuO powder having an average particle size of about 2 μm were mixed in a ball mill for 48 hours. To 100 parts by weight of this powder mixture, 1 part by weight of ethylcellosolve, 10 parts by weight of terpineol, 0.6 part by weight of a thixotropy agent and 20 parts by weight of methylethylketone were added and mixed in the ball mill for 72 hours. The mixture was grounded in an agate mortar for 1.5 hours and then n a three-roll mill, and thus a superconducting ceramic paste was obtained.

Figure 1:
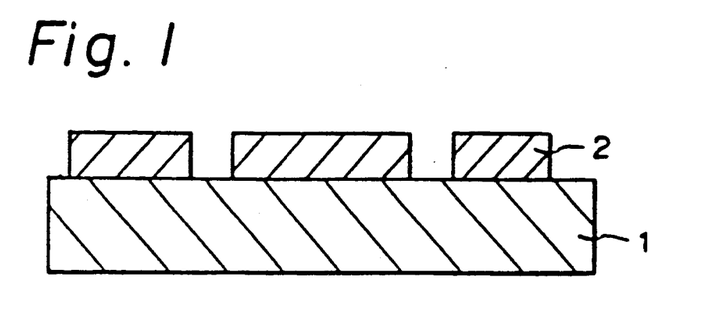
FIG. 1 is a sectional view of a superconducting circuit board according to the invention.

This paste was screen printed on various alumina boards to for an interconnection pattern, and then fired in air at 1020° C. for 4 hours. The thickness of the pattern was 25 μm. In the following samples, the thickness of the pattern was varied. FIG. 1 shows the resultant alumina substrate 1 on which the interconnection pattern 2 is formed.

The resultant alumina board with the pattern was immersed in liquid nitrogen and the electrical characteristics of the patterns were measured.

The results are shown in Table 1.

when the alumina board did not contain a vitrious impurity, the fired pattern on the alumina board exhibited a superconductivity even if the thickness of the pattern was as thin as 25 μm.

EXAMPLE 2

The paste of Example 1 was screen printed on alumina board sample No. 9 shown in Table 1 (99.7% alumina with 0.3% MgO and $Cr_2O_3$) to form a pattern having a thickness of 25 μm, and was then fired in air at 850° C for 1 hour.

The resultant fired pattern exhibited superconductivity in liquid nitrogen.

EXAMPLE 3

(Preparation of Superconducting Ceramics)

Figure 2A:
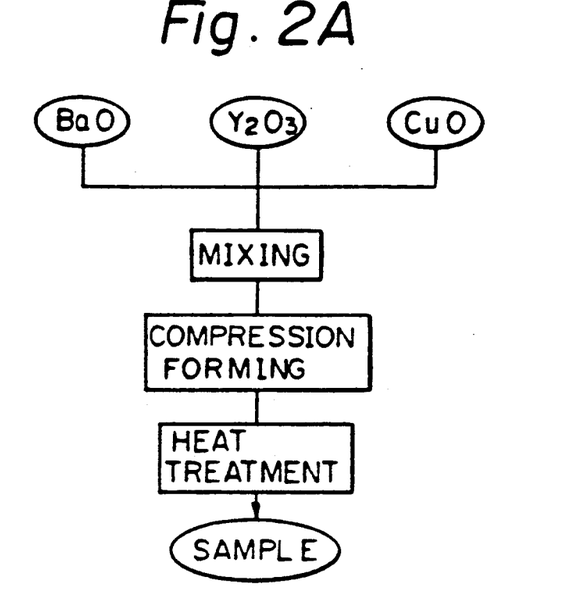
FIGS. 2A and 2B are flow charts of the manufacturing process of a superconducting ceramics.

FIG. 2A shows a flow chart of the process of manufacturing a Ba-Y-Cu-O system superconducting ceramics. In the first step, the starting materials of BaO, $Y_2O_3$ and CuO powders were mixed at a predetermined ratio; in the second step, the starting materials were wet milled and ground to form powders having an average particle size of less than 2 μm; in the third step, the powders were formed into a shape; and in the fourth step, the shaped body was fired in an oxidizing atmosphere at 550° to 1100° C., preferably 800° to 1100° C., more preferably 800° to 900° C., to obtain a Ba-Y-Cu-O system oxide.

Figure 2B:
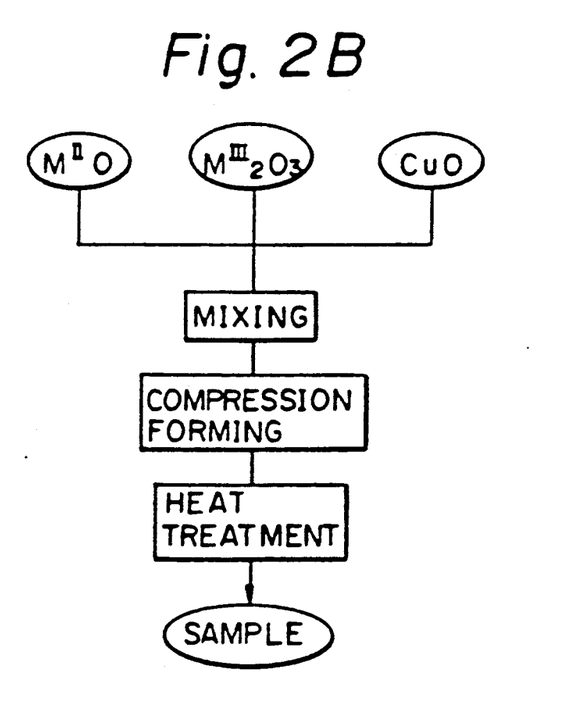

FIG. 2B shows a flow chart of the process of manufacturing a superconducting ceramics of which is very similar to FIG. 2A.

Figure 3:
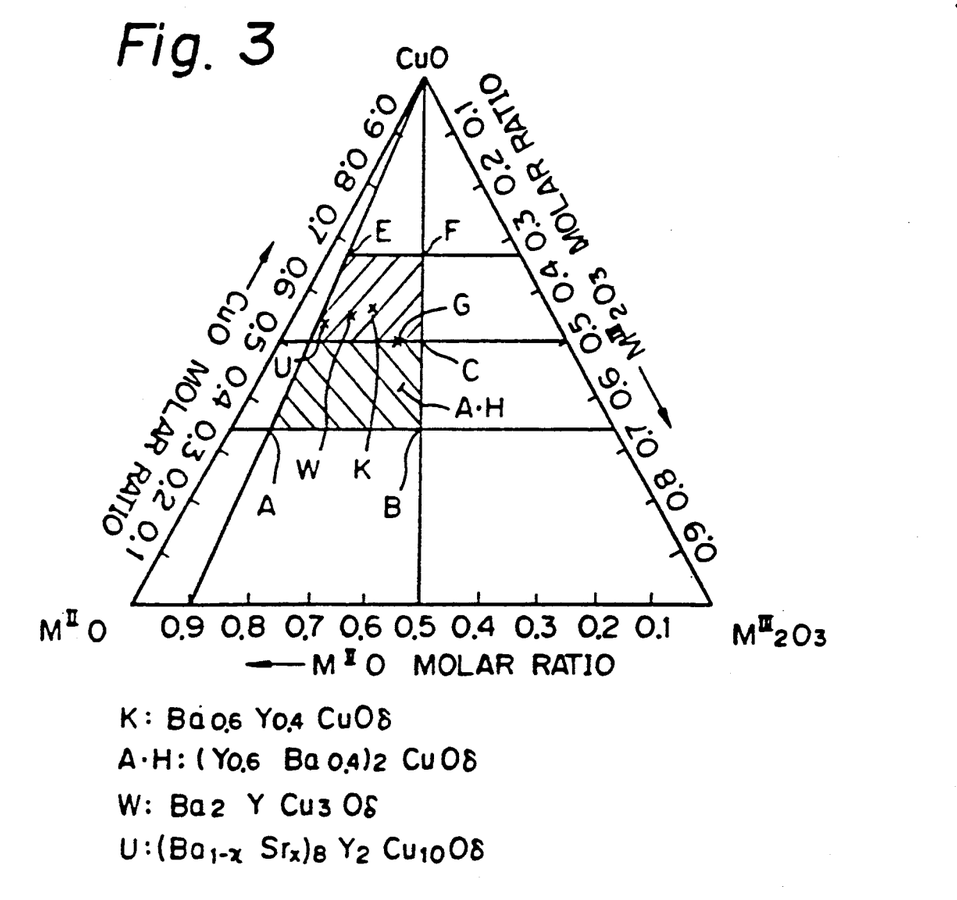
FIG. 3 shows an area of composition of a superconducting ceramics in $M^{II}O-M_2^{III}O_3-CuO$ system.

In accordance with the flow chart of FIG. 2A or 2B, samples of $M^{II}$-$M^{III}$-Cu-O system oxides were prepared from various ratios of $M^{II}O$, $M_2^{III}O_3$ and CuO, and the shaped bodies were fired in air at 850° C. for 6 hours. The electrical resistance of the resultant samples (cut to 2×4×14 mm) was measured by the four probe method. FIG. 3 shows an area of the composition at which the sample exhibited superconductivity at the temperature of liquid nitrogen (77 K). The superconductivity at 77 K was exhibited in the hatched area.

From this experiment, it was found that a superconductivity at 77 K was obtained when the composition of the starting materials was as follows:

TABLE 1

| Sample No. | Purity of alumina (%) | Impurity | Sueface roughness (%) | Superconductivity (at 20 μm) | Minimum thickness for exhibiting superconductivity (μm) |
|---|---|---|---|---|---|
| 1 | 92 | vitrious | 1.1 | x | xx |
| 2 | 96 | vitrious | 0.6 | x | xx |
| 3 | 97 | vitrious | 0.3 | x | xx |
| 4* | 99 | vitrious | 0.1 | x | 500 |
| 5* | 99.5 | vitrious | 0.06 | x | 200 |
| 6 | 92 | vitrious | 1.0 | x | xx |
| 7 | 96 | vitrious | 0.7 | x | xx |
| 8* | 99.5 | vitrious | 0.07 | x | 200 |
| 9* | 99.7 | MgO, $Cr_2O_3$ | 0.03 | o | <20 |
| 10* | 100 | — | 0.01 | o | <20 |

Note)
o: Superconductivity exhibited
x: Superconductivity not exhibited
xx: Superconductivity not exhibited even if thickness thickned by screen printing method
*Example of present invention It can be seen from Table 1 that a superconductivity of the fired pattern was exhibited when the alumina board contained more than 99% of alumina, and that where $0.5 \leq x \leq 0.9$, $1 \leq y \leq 2$ and $1 \leq z \leq 2$. However, this composition of the starting materials was different from the composition of the superconducting ceramics obtained by firing the starting materials. The latter is as shown below:

$$\{(M^{II}O)_x(M_2^{III}O_3)_{1-x}\}_y(CuO)_z(O)_\delta$$

where $0.5 \leq 0.9$, $1 \leq y \leq 2$, $1 \leq z \leq 2$ and $\delta$ stands for a deviation of the oxygen concentration from the stoichiometric amount thereof. The deviation of the oxygen concentration depends on the atmosphere and other firing conditions. Generally, $-1 < \delta < 2$. However, FIG. 3 represents the composition of the superconducting ceramics after firing, by considering another axis, for example, an axis perpendicular to the sheet of FIG. 3 for the oxygen concentration.

In the above preparation, the Ba-Y-Cu-O system superconducting ceramics entered a liquid phase at about 850° C., but did not enter the liquid phase at 800° C. when observed by eye.

In FIG. 3, the point K shows the composition $Ba_{0.6}Y_{0.4}CuO_\delta$, and A.H. shows the composition If $x<0.5$, $x>0.9$, or $z<1$, a superconducting ceramics is not obtained, and if $z>2$, only a small amount of superconducting ceramics can be obtained.

The molar ratios of the starting materials are as shown below. Here, $M^{II}O$, $M_2^{III}O_3$ and CuO are considered to be xy, y(1-x), and z moles. Then, the molar ratio of $M^{II}O = \dfrac{xy}{xy + y(1-x) + z} = \dfrac{xy}{y+z}$ the molar ratio of $M^{III}O_3 =$ $$\dfrac{y(1-x)}{xy + y(1-x) + z} = \dfrac{y}{y+z}(1-x)$$

and the molar ratio of $CuO = \dfrac{z}{xy + y(1-x) + z} = \dfrac{z}{y+z}$

Typical molar ratios are shown in Table 2.

TABLE 2

| z | y | x | Molar ratio of $M^{II}O$ | Molar ratio of $M_2^{III}O$ | Molar ratio of CuO |
|---|---|---|---|---|---|
| 1 | 1 | 0.5 | 0.25 | 0.25 | 0.5 |
| 1 | 1 | 0.9 | 0.45 | 0.05 | 0.5 |
| 1 | 2 | 0.5 | 0.3 | 0.3 | 0.3 |
| 1 | 2 | 0.9 | 0.6 | 0.06 | 0.3 |
| 2 | 1 | 0.5 | 0.16 | 0.16 | 0.6 |
| 2 | 1 | 0.9 | 0.29 | 0.03 | 0.6 |
| 2 | 2 | 0.5 | 0.25 | 0.25 | 0.5 |
| 2 | 2 | 0.9 | 0.45 | 0.05 | 0.5 |

EXAMPLE 4

(Typical Superconducting Ba-Y-Cu-O System)

Powders of BaO, $Y_2O_3$ and CuO were mixed at a ratio of 3:2:5, and milled for 24 hours in a ball mill containing acetone and alumina balls. The kneaded powders were dried and shaped under a pressure of 200 MPa at room temperature, and the resultant shaped body was fired in air at 850° C. for 6 hours. A Ba-Y-Cu-O system oxide was obtained.

Figure 4:
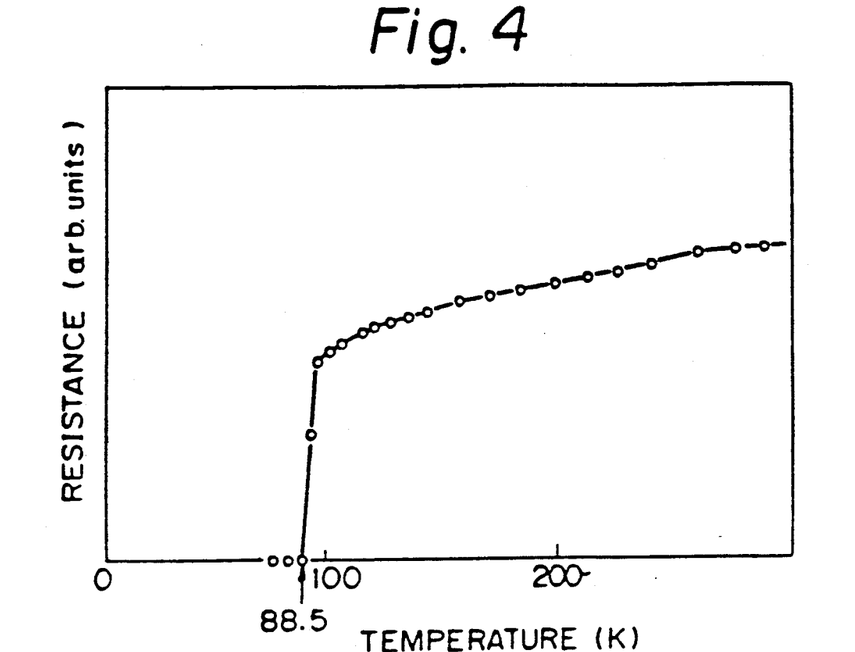
FIG. 4 shows the relationship between the electrical resistance of the Ba-Y-Cu-O system sample and the temperature in Example 4.

The electrical resistance of the obtained sample was measured by the four probe method, and the electrical resistance of the sample in relation to the temperature shown in FIG. 4. The resultant $T_{c\text{-}end}$ was 88.5 K and the sample exhibited superconductivity at the liquid nitrogen temperature (77 K).

Figure 5:
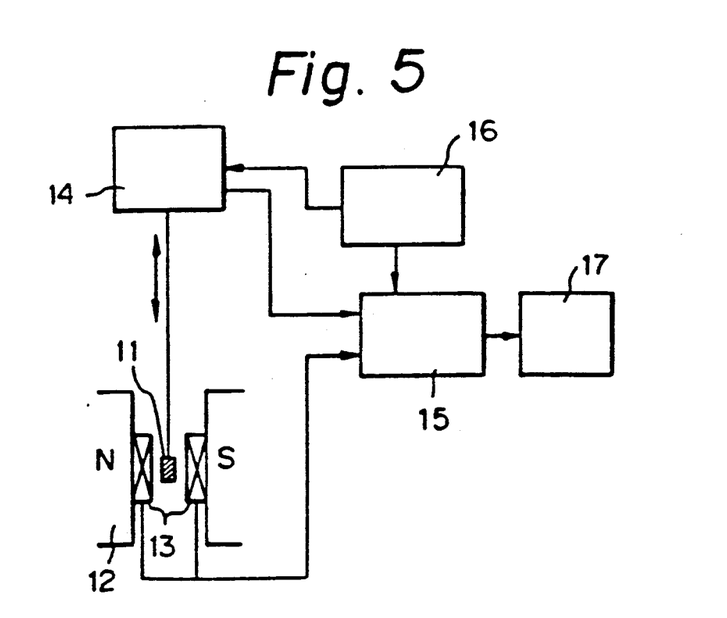
FIG. 5 is a schematical view of a system for measuring a magnetization of a sample.

The magnetization of the sample was measured in a magnetization measuring system shown in FIG. 5, in which reference numeral 11 denotes the sample, 12 a magnet, 13 a pick-up coil, 14 a drive means, 15 a detector and amplifier, 16 an operating system center, and 17 a display device. The results are given below.

| Temperature (K) | Magnetization (emu/g) |
|---|---|
| 300 | $3.4 \times 10^{-6}$ |
| 77 | $-5.8 \times 10^{-2}$ |

Figure 6:
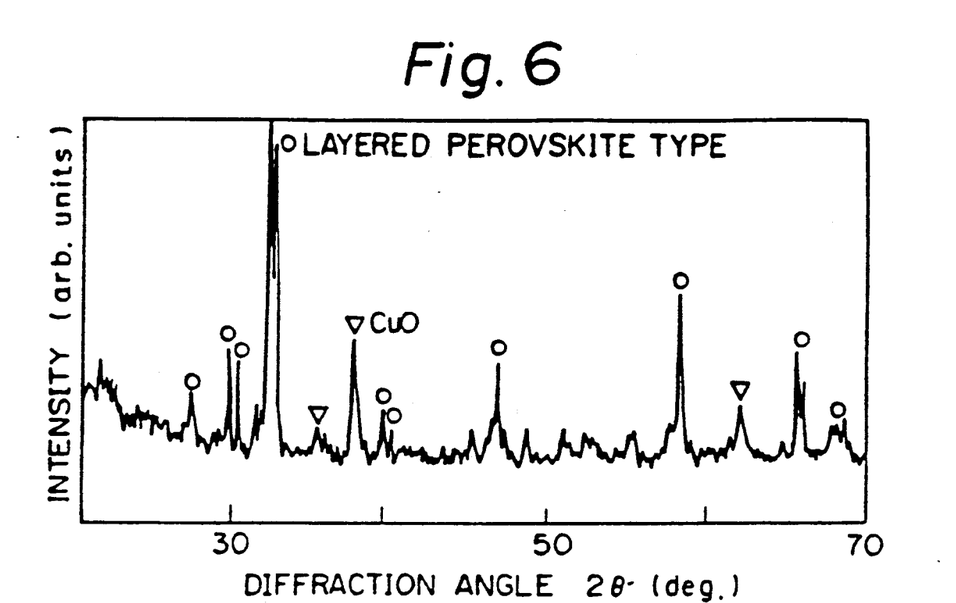
FIG. 6 is an X ray diffraction pattern of the Ba-Y-Cu-O system sample of Example 4.

The sample was then subjected to X ray diffraction analysis with Cu-$K_\alpha$ ray having a wavelength of 0.154 nm. The results are shown in FIG. 6. In FIG. 6, the peaks marked o show the existence of the perovski's type structure and the peaks marked V show the existence of CuO.

EXAMPLE 5

(Partial Replacement of Ba in Ba-Y-Cu-O System With Sr)

Samples of (Ba, Sr)-Y-Cu-O system were prepared having the composition $(Sr_xBa_{1-x})_8Y_2Cu_{10}O_\delta$ where $x=0, 0.125, 0.25, 0.375, 0.5$ and 0.75, corresponding to the point U in FIG. 3. The starting materials were powders of $Y_2O_3$ (99.9%, particle size of about 2–3 μm), $BaCO_3$ (99.9%, particle size of about 2 μm), SrO (99%, particle size of about 2–3 μm) and CuO (99.9%, particle size of about 2 μm). These starting powders were mixed at molar ratios necessary to obtain the above compositions, kneaded and ground for 24 hours in a ball mill, and then shaped under a pressure of 200 MPa to form pellets having a radius of 15 mm and a thickness of about 3 mm. The pellets were fired on an alumina board in air at 950° C. for 12 hours.

The temperature-dependent resistivity, powder X ray diffraction, and temperature-dependent magnetization (by vibrating sample magnetometer) of the resultant samples were measured, the out surface of the sample was observed by a scanning electron microscope.

Figure 7:
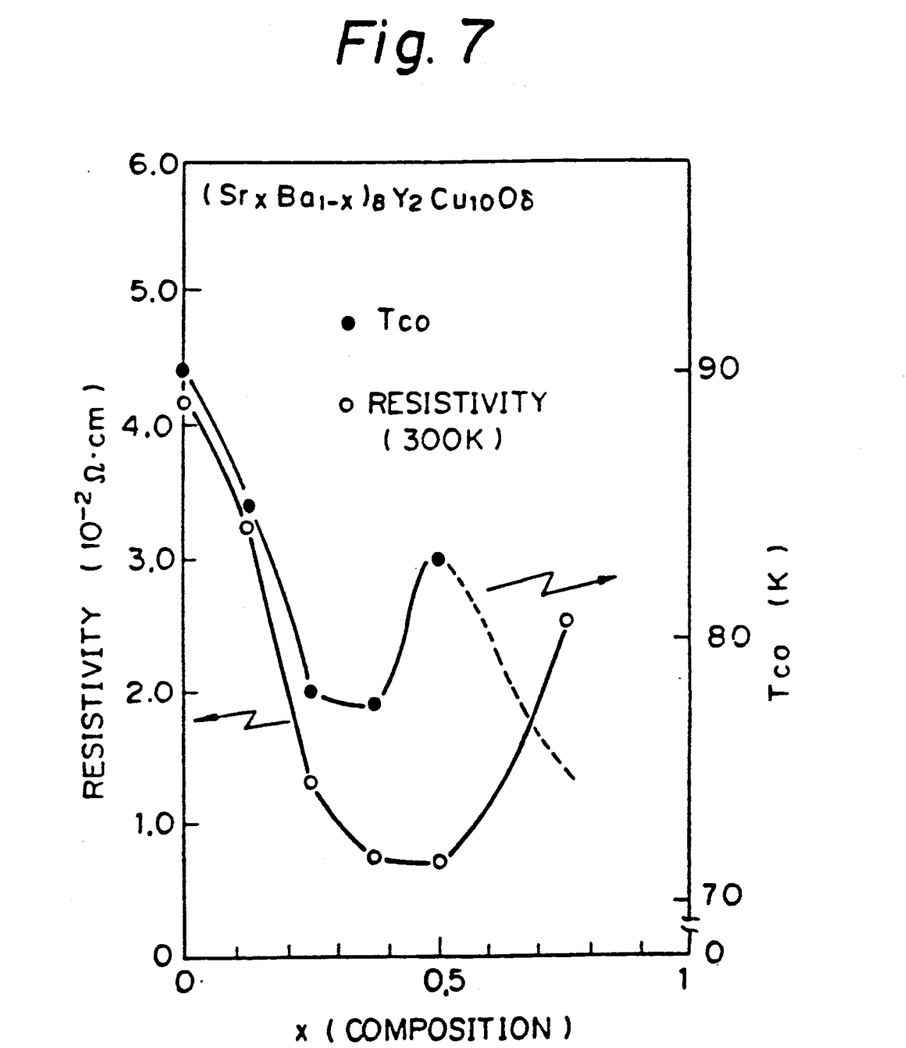
FIG. 7 is electrical resistance and $T_{co}$ of the sample $(Ba_{1-x}Sr_x)_8Y_2Cu_{10}O_\delta$ in relation to the composition in Example 5.

FIG. 7 shows the onset temperature $T_{co}$ and the resistivity at room temperature of the samples having different compositions, in relation to those compositions. The $T_{co}$ of the sample where $x=0.75$ was lower than 77 K.

As seen in FIG. 7, the resistivity at room temperature tends to decrease with a decrease of the Sr concentration, but reaches a minimum at $x=0.5$ and increases again with an increase of x beyond 0.5. The decrease of the Sr concentration causes a corresponding decrease of the $T_{co}$, in spite of a decrease of the resistivity at room temperature, but the $T_{co}$ is abruptly increased at $x=0.5$ and rapidly decreased at $x=0.75$, to a temperature lower than 77 K. That is, at the point $x=0.5$, i.e., a Ba/Sr ratio of 1:1, the properties of the sample are varied.

Figure 14A:
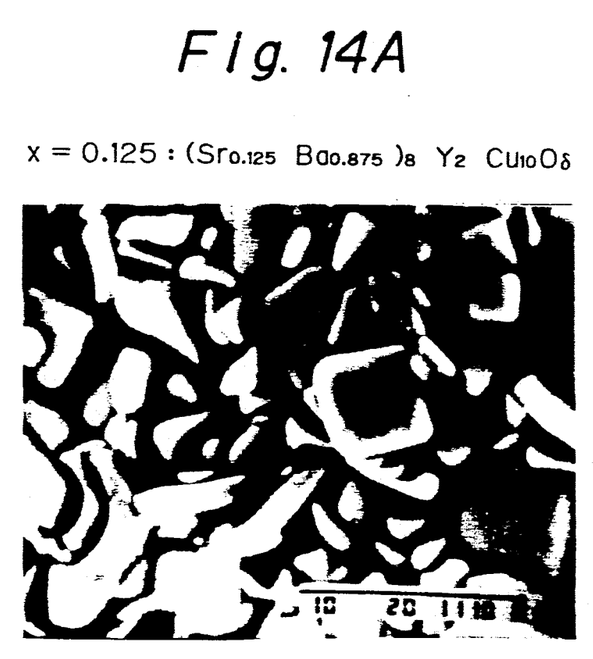
FIGS. 14A and 14B are photographs of $(Sr_{0.125}Ba_{0.875})_8Y_2Cu_{10}O_\delta$ and $(Sr_{0.5}Ba_{0.5})_8Y_2Cu_{10}O_\delta$, respectively.
Figure 14B:
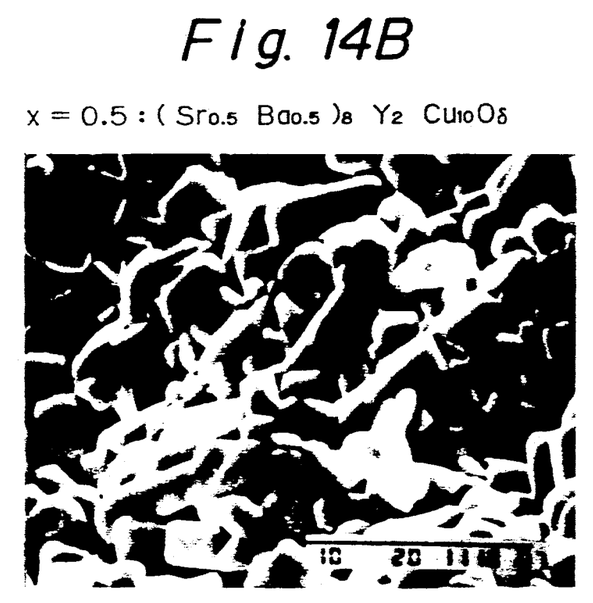

From the SEM photographs of the samples of $x=0.125$ and $x=0.5$, it was found that the sample of $x=0.5$ had a smaller grain size and a higher density (see FIGS. 14A and 14B). If the resistivity of the grains are the same in the samples, the sample having a higher density has a smaller resistivity, and thus the decrease of the resistivity at room temperature at $x=0.5$ is considered to be a result of the increase of the density. A replacement of Ba by Sr has an effect of increasing the density of the Ba-Y-Cu-O system superconducting ceramic material.

Around $x=0.5$, the sample is denser and the $T_{co}$ is relatively high. Therefore, a composition around $x=0.5$, for example, $x=0.4$ to 0.6, is preferable to obtain a good superconducting ceramic pattern.

Figure 8:
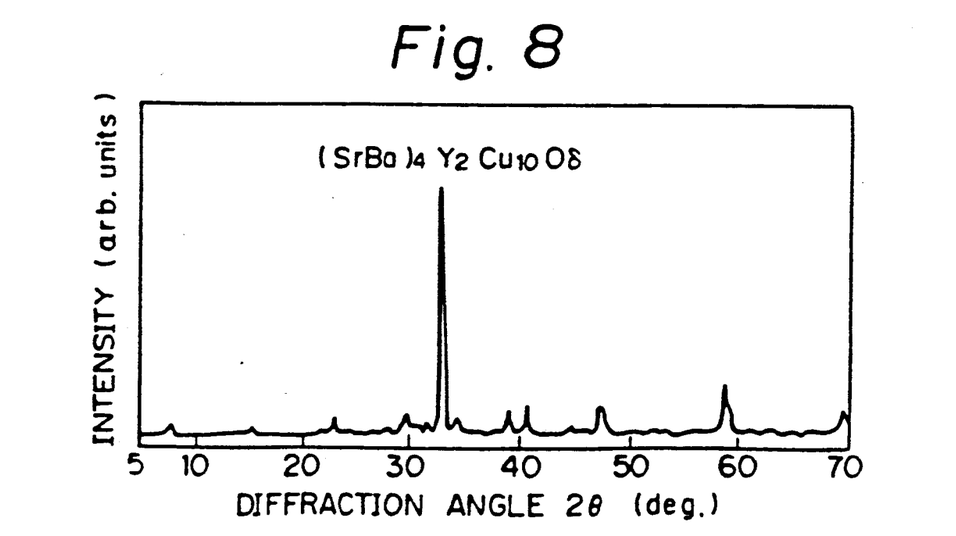
FIG. 8 is an X ray diffraction pattern of the sample $(SrBa)_4Y_2Cu_{10}O_\delta$ in Example 5.

FIG. 8 shows the powder X ray diffraction pattern of a sample of $x=0.5$. The pattern does not show split peaks around $2\theta=32$ degrees, corresponding to the crystal planes (103) and (013) of the orthorhombic system crystal. To determine the exact crystal structure, the method of least squares was used to calculated the lattice constant. The values of the observation, theory, and then differences of certain patterns are shown in Table 3.

TABLE 3

$(SrBa)_4Y_2Cu_{10}O_\delta$.
$a = 0.385^0$ nm, $b = 0.385^6$ nm, $c = 1.157^9$ nm

| hkl | $2\theta$ (obs) | $2\theta$ (cal) | diff |
|---|---|---|---|
| 001 | 7.613 | 7.636 | 0.023 |
| 003 | 23.053 | 23.046 | −0.007 |
| 010 | 23.053 | 23.079 | 0.026 |
| 103 | 32.873 | 32.844 | −0.029 |
| 110 | 32.873 | 32.868 | 0.005 |
| 005 | 38.805 | 38.894 | 0.089 |
| 113 | 40.522 | 40.526 | 0.004 |
| 006 | 47.168 | 47.097 | −0.071 |
| 020 | 47.168 | 47.168 | 0.000 |
| 123 | 58.624 | 58.668 | 0.044 |
| 116 | 58.624 | 58.622 | −0.002 |

The difference between the theoretical and observatory values of every angle was less than 0.1 degree, and thus it was determined that the lattice constants were as shown below:

$a=0.385^0$ nm, $b=0.385^6$ nm, $c=1.157^9$ nm. The crystal structure was a tetragonal system, since a is equal to b.

An X ray diffraction pattern of the sample of $X=0$ had split peaks around 32 degrees, demonstrating that the sample is a orthorhombic system. Therefore, it was found that the crystal structure was transformed from orthorhombic to tetragonal systems at $x=0.5$.

Figure 9:
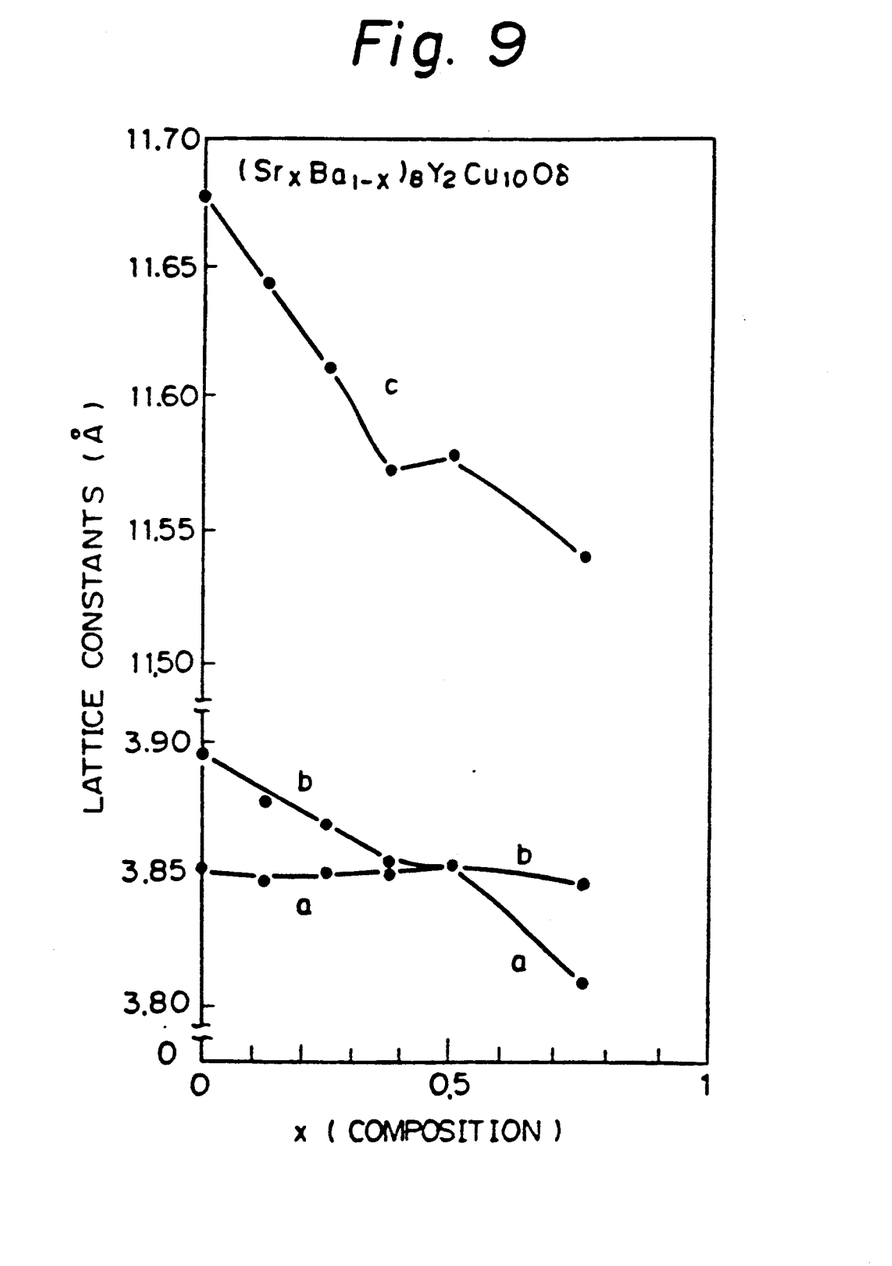
FIG. 9 shows the lattice constants of the samples $(Sr_xBa_{1-x})_8Y_2Cu_{10}O_\delta$ in relation to the composition in Example 5.

In the same way as above, the lattic constants of the samples having various compositions were determined and are shown in FIG. 9. This result can be summarized into the following three groups, in which a change of $T_{co}$ is relation to the composition is also shown, for reference:

TABLE 4

| Composition | Lattice constant | | | $T_{co}$ |
|---|---|---|---|---|
| | a axis | b axis | c axis | |
| $x < 0.5$ | constant | decrease | decrease | decrease |
| $x = 0.5$ | a = b | | increase | increase |
| $x > 0.5$ | decrease | constant | decrease | decrease |

Figure 10:
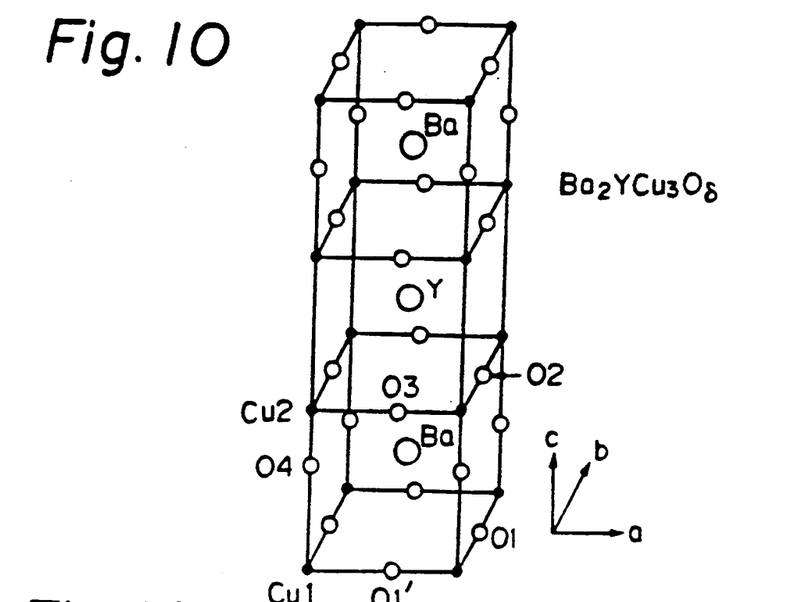
FIG. 10 is a schematical view of a unit cell of the crystal structure of a superconducting ceramics $Ba_2YCu_3O_\delta$.

Assuming that the barium of the crystal structure of $Ba_2YCu_3O_\delta$, is replaced by strontium, the changes of the lattice constants and $T_{co}$ of the above samples dependent on the composition can be explained as below. FIG. 10 illustrates a unit cell of the crystal structure of $Ba_2YCu_3O_\delta$, which corresponds to the point W in FIG. 3.

The decrease of the lattice constant of the c axis at the composition other than $x=0.5$ is considered to be caused by the replacement of Ba by Sr having an ion radius smaller than that of Ba.

When $x<0.5$, with an increase of the Sr concentration, the oxygens (01) on the b axis are removed to cause a decrease of the lattice constant of the b axis, but the oxygens (01') on the a axis are not removed sine there are many vacancies at the oxygen sites (01') on the a axis, and thus there is no change of the lattice constant of the a axis. The decrease of $T_{co}$ is assumed to be caused by a gradual breaking of the linear chains of Cu-O on the b axis.

When $x=0.5$, almost all of the oxygens (01) on the b axis are removed, and thus the lattice constant of the b axis becomes equal to that of the a axis; i.e., the orthorhombic system is transferred to the tetragonal system. With this structure, the linear chains of Cu-O are almost lost, but superconductivity is observed, and therefore, this superconductivity is attributed to the two-dimensional plane of the CuO, not the linear or one-dimensional chain of the Cu-O.

When $x>0.5$, if it is assumed that the oxygens (03) are removed with an increase of the Sr concentration, the decrease of the lattice constant of the a axis can be explained. Moreover, the $T_{co}$ is then abruptly decreased, since the oxygens (03) are a determinant of the superconductive current. Furthermore, if the oxygens on this site (03) are removed, the resistivity of the grains is increased, which cooperates with the increase of the density of the sample to increase the resistivity at room temperature.

Figure 11:
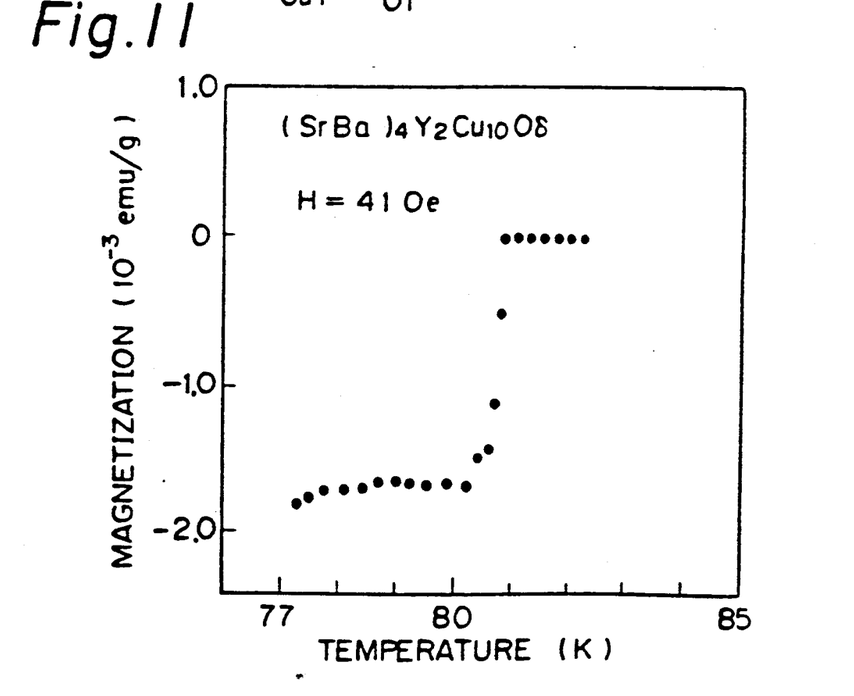
FIG. 11 shows the magnetization of $(SrBa)_4Y_2Cu_{10}O_\delta$ in relation to the temperature.

FIG. 11 shows the magnetization of the sample of $x=0.5$ at a magnetic flux density of 41 Oe, in relation to the temperature. It was confirmed that, at $T_c=80.9$ K, a complete diamagnetism was demonstrated to show a transformation to a superconductor. Since a zero electrical resistance and the Meissner effect were observed, the sample of $x=0.5$ was a superconductor although it has a crystal structure of the tetragonal system. The $T_{co}$ was then about 83 K.

EXAMPLE 6

(Titanium Coupling Agent)

0.6 mole of BaCO powder (average particle size of about 1 μm), 0.4 mole of $Y_2O_3$ powder (about 1 μm) and 1 mole of CuO powder (about 2 μm) are mixed for 48 hours in a ball mill. To 100 parts by weight of this mixture, 3 parts by weight of polymethylmethacrylate resin as a binder, 20 parts by weight of terpineol as a nonvolatile solvent, 6 parts by weight of a titanium coupling agent (KR-QS, sold by Ajinomoto K.K.) and 20 parts by weight of methylethylketone as a volatile solvent, were added and ball milled for 72 hours. The mixture was ground in an agate mortar for 1.5 hours and passed through a three-roll mill 30 times to form a superconducting ceramic paste.

The paste was printed on a sintered alumina board (99.7% alumina with 0.3% MgO and $Cr_2O_3$) to form a pattern having a thickness of 25 μm and a width of 100 μm, which was fired in air at 950° C. for 0.5 hours.

The resultant board was immersed in liquid nitrogen, and the electrical resistance of the pattern was measured and found to be zero.

The adhesion of the fired pattern to the alumina board was measured by the peeling test. The adhesion force was found to be more than 3 kg/mm². In comparison, the adhesion of the fired pattern was about 0.7–1.5 kg/mm² when the fired pattern was formed by the same procedures as above, except that the titanium coupling agent was omitted.

EXAMPLE 7

(Silane Coupling Agent)

Example 6 was a repeated, except that the titanium coupling agent was replaced with a silane coupling agent (A-187 sold by Nippon Yunika K.K.). The electrical resistance and the adhesion of the fired pattern were similar to those of Example 6.

EXAMPLE 8

(Ba-Y-Cu-O System Pattern)

The bulk of a superconducting ceramics having a composition of $Ba_2YCu_3O_\delta$ was pulverized to an average particle size of about 1 µm. To 100 parts by weight of the superconducting ceramic powder, 5 parts by weight of polymethylacrylate resin, 20 parts by weight of terpineol, 100 parts by weight of methylethylketone, were added and ball milled for 72 hours, ground in an agate mortar for 3 hours, and then roll milled 30 times, and thus a paste of the superconducting ceramic material was obtained.

This paste was printed on an alumina board (99.7% alumina with 0.3% MgO and $Cr_2O_3$), which was fired in air at 850° C. for 950 hours.

Figure 12:
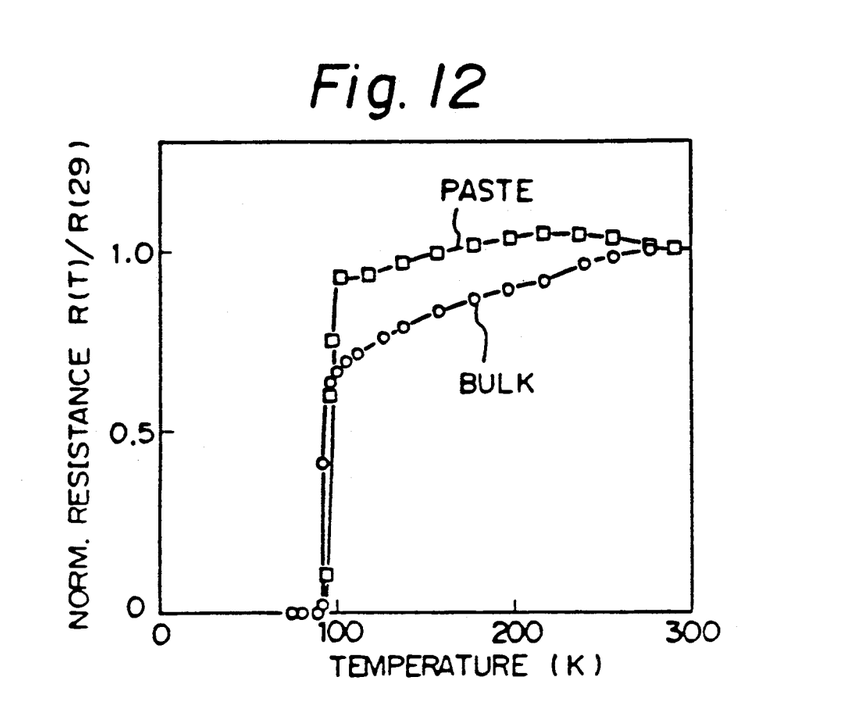
FIG. 12 is electrical resistance of a bulk and a film of a superconducting ceramics in Example 7.
Figure 13:
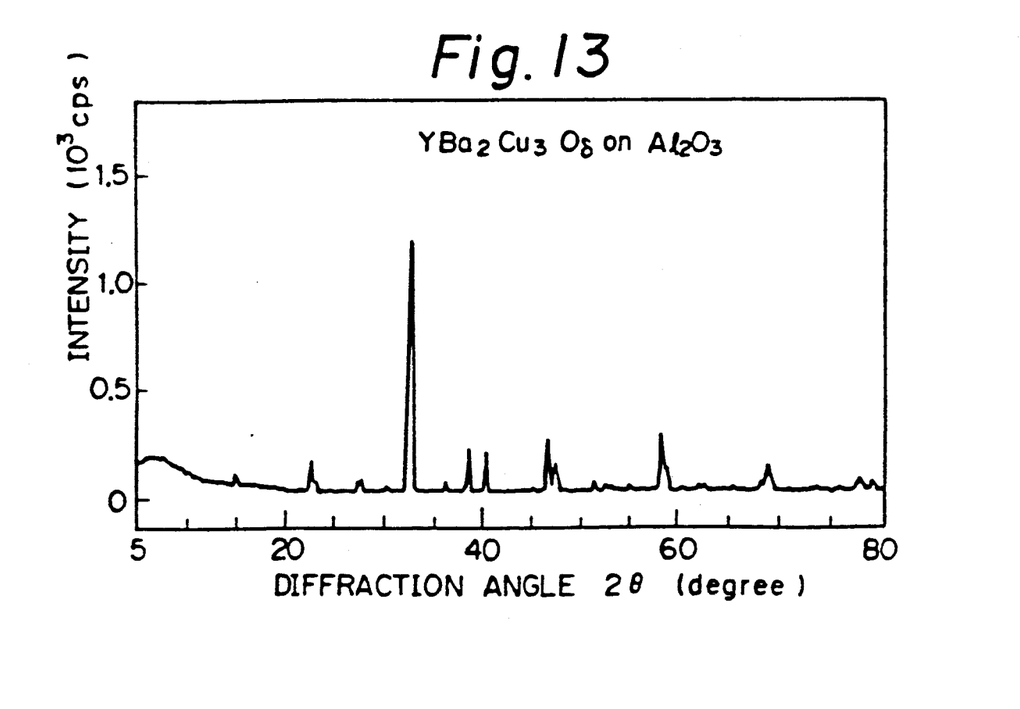
FIG. 13 is an X ray diffraction pattern of the fired pattern of film of $Ba_2YCu_3O_\delta$ formed on alumina board in Example 8.

It was confirmed that the resultant fired pattern on the alumina board exhibited the superconductivity shown below. The electrical resistance of the fired pattern on the alumina board in relation to the temperature is shown in FIG. 12, and the $T_{c\text{-}end}$ was 89 K, which is very similar to the $T_{c\text{-}end}$ of the bulk, although the electrical resistance of the fired pattern was a little higher than that of the bulk above $T_c$. The magnetization of the fired pattern was measured by a vibrating sample magnetometer (VSM) and showed the Meissner effect, although the degree of diamagnetism of the pattern was lower than that of the bulk. FIG. 13 shows the X ray diffraction pattern of the fired pattern on the alumina board, which has the same peaks of $Ba_2YCu_3O_\delta$ as the bulk.

EXAMPLE 9

(Ba, Sr)-Y-Cu-O System Pattern)

The bulk of the superconducting ceramics of $(Sr_{0.5}Ba_{0.5})_8Y_2Cu_{10}O_\delta$ was pulverized to an average particle size of about 1 µm. The procedures of Example 8 were then repeated to form a fired pattern of $(Sr_{0.5}Ba_{0.5})_8Y_2Cu_{10}O_\delta$ on a sintered alumina board (99.7% alumina with 0.3% MgO and $Cr_2O_3$)

This fired pattern demonstrated superconductivity and a high density.

EXAMPLE 10

(Replacement of CuO With Metal Copper)

Powders of 52 g (0.3 mole) of $BaCO_3$, 20 g (0.2 mole) of $Y_2O_3$ and 28 g (0.5 mole) of metal copper were mixed. To the mixture, 100 g of methylethylketone was added and ball milled for 50 hours. Then, to this mixture, 0.9 g of ethylcellulose as a binder, 2.5 g of terpineol as a non-volatile solvent, and 2.6 g of dibuthylphthaiate as a plasticizer were added, ground in an agate mortar for 10 hours, and passed through a three-roll mill 45 times to obtain a paste having a viscosity of about 2000 poise.

The paste was printed through a 300 mesh screen onto a sintered alumina board (99.7% alumina with 0.3% MgO and $Cr_2O_3$) by the screen printing method to form an interconnection pattern having a width of about 150 µm. The alumina board with the paste pattern was fired in air at 900° C. for 6 hours.

The electrical resistance of the fired pattern was measured, and is as shown in FIG. 12, in which the electrical resistance was zero at 77 K. The Meissner effect was also confirmed, and thus the fired pattern was a superconducting ceramic interconnection pattern.

Figure 15A:
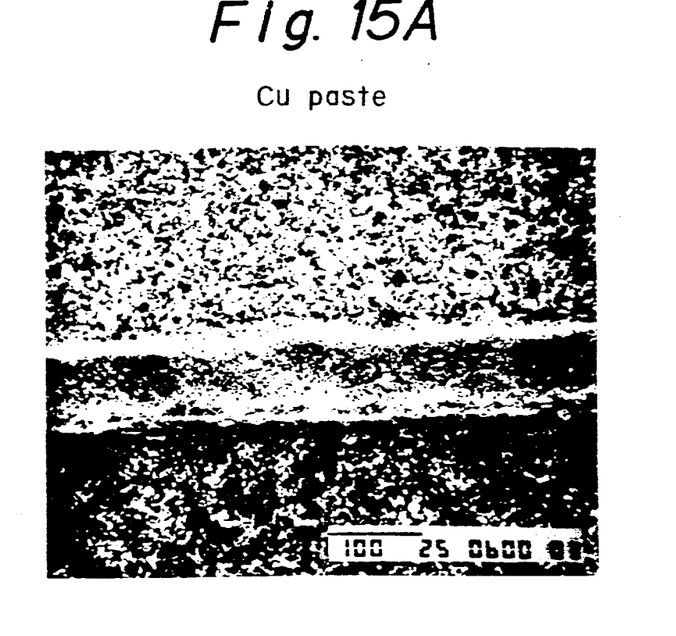
FIGS. 15A and 15B are photographs of fired patterns made using Cu and CuO powders respectively.
Figure 15B:
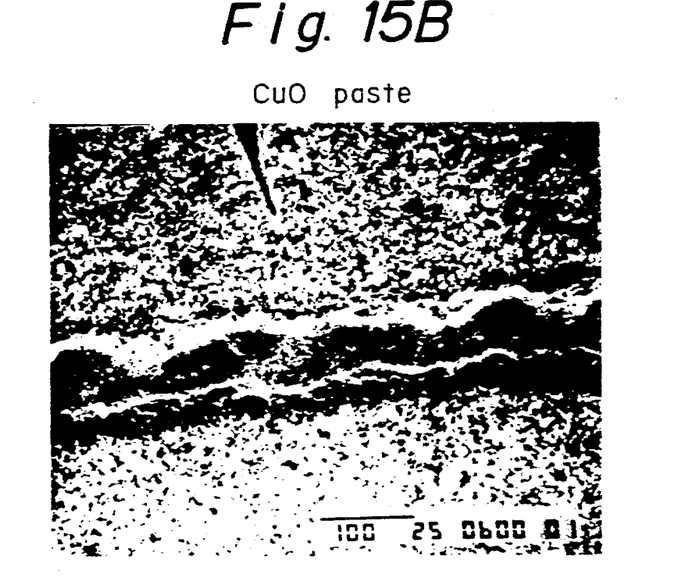

This fired pattern is shown in FIG. 15A. In contrast, FIG. 15B is a similar photograph of a fired pattern manufactured by the same procedures as above except that CuO powder was used in place of the Cu powder. As seen in FIGS. 15A and 15B, the printed and fired pattern made using a copper powder is very clear, but the printed and fired pattern made using a CuO powder is deformed.

Similarly, the above pastes containing the copper powder or the CuO powders were printed to form patterns having various widths on the alumina boards, and the procedures mentioned above were repeated to fire the alumina boards with the patterns. The resultant fired patterns were examined to determine if they exhibited superconductivity, and the results are as shown in Table 5.

TABLE 5

| Line width (µm) | Paste with CuO | Paste with Cu |
| --- | --- | --- |
| 500 | o | o |
| 300 | o | o |
| 200 | o | o |
| 150 | x | o |
| 100 | x | o | o: Superconducting pattern formed with deformation of pattern within 10% of width.
x: Superconducting pattern not formed.

EXAMPLE 11

(Supplemental Copper Powder)

100 g of a powder of a superconducting ceramic material of $Ba_2Y Cu_3O_\delta$, having an average particle size of about 1 µm, was mixed with 7 g of a metal copper powder, 3 g of ethylcellulose, 20 g of terpineol, 5 g of dibutylethylketone and 100 g of methylethylketone and ball milled for 50 hours. The mixture was ground in an agate mortar for 10 hours and passed 45 times through a three-roll mill to obtain a paste having a viscosity of about 2000 poise.

The paste was printed through a 300 mesh screen onto a sintered alumina board (99.7% alumina and 0.3% MgO and $Cr_2O_3$) by the screen printing method to form an interconnection pattern having a width of 150 µm and a thickness of 25 µm. The pattern on the alumina board was fired in air at 900° C. for 6 hours.

The resultant fired pattern exhibited superconductivity and the electrical resistance thereof become zero at 77 K.

EXAMPLE 12

(Multilayer Interconnection)

Figure 16:
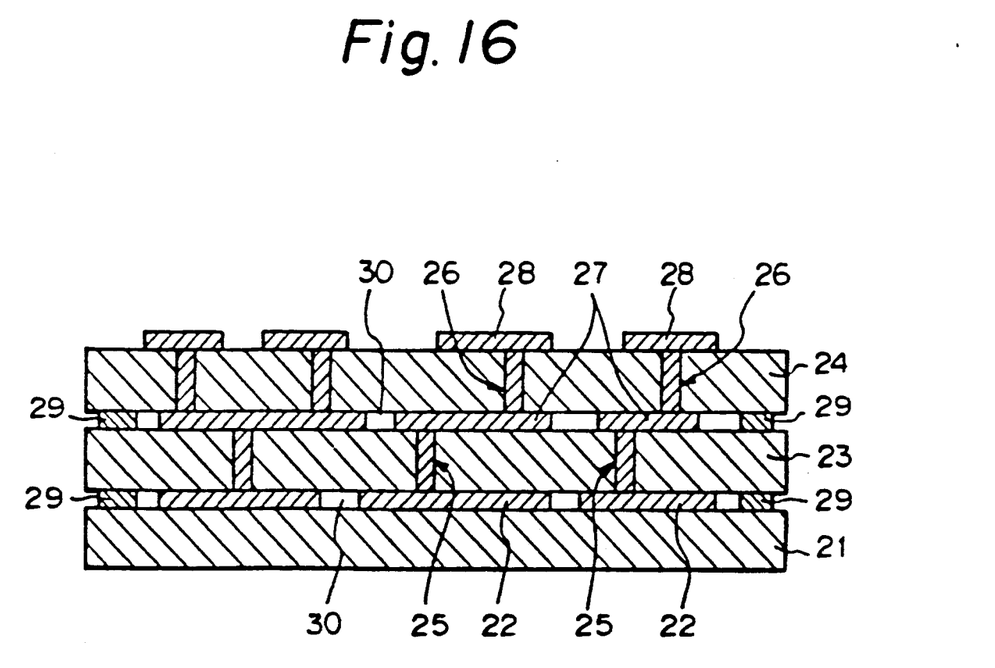
FIG. 16 is a sectional view of a multilayer circuit substrate in Example 12.

FIG. 16 is referred. A plurality of sintered 25 alumina boards (99.7% alumina with 0.3% MgO and $Cr_2O_3$) having a thickness of 0.2 mm were prepared. On an alumina board 21, a pattern of a superconducting ceramic paste 22 having a thickness of 40 µm was printed. Alumina boards 23 and 24 were perforated by a laser beam to form piercing holes 25 and 26 into which a superconducting ceramic paste was filled. Onto the alumina boards 23 and 24, patterns 27 and 28 of a superconducting ceramic pate were formed. Near the peripherics of the alumina boards 21 and 23, a gold paste 29 was printed as an adhesive. Then, the alumina boards 21, 23 and 24 were stacked and fired in air at 950° C. for 30 minutes. Thus, a multilayer circuit board as shown in FIG. 16 was obtained, in which spaces 30 are seen.

We claim:

1. A superconducting circuit board, comprising:
a sintered alumina board containing more than 99% by weight of alumina; and
a superconducting ceramic pattern formed on the alumina board, the superconducting ceramic pattern is made of a superconducting oxide represented by the general formula:

where A stands for at least one element selected from the group consisting of Ba, Sr, Ca and Mg; R stands for at least one element selected from the group consisting of Sc Y, La, Ce, Pr, Nd, Sm, Eu, Gd, Tb, Dy, Ho, Er, Tm, Yb and Lu; M stands for at least one metal selected from the group of copper, silver and gold, and O stands for oxygen.

2. A substrate according to claim 1, wherein the sintered alumina board does not contain more than 0.5% by weight of a composition including at least one of a vitreous component and an amorphous component.

3. A circuit board according to claim 1, wherein the sintered alumina board contains more than 99.7% by weight of alumina and less than 0.3% of at least one of MgO and $Cr_2O_3$.

4. A circuit board according to claim 1, wherein the superconducting ceramic pattern is made of a superconducting ceramics of Bi-Sr-Ca-Cu-O or Tl-Bi-Sr-Ca-Cu-O system.

5. A superconducting circuit board comprising:
a sintered alumina board containing more than 99% by weight of alumina;
a superconducting ceramic pattern formed on the alumina board, the superconducting ceramic pattern containing 100 parts by weight of a superconducting ceramics and 0.01 to 10 parts by weight of at least one of titanium and silicon oxide compounds, the superconducting ceramic pattern is made of a superconducting oxide represented by the general formula:

where A stands for at least one element selected from the group consisting of Ba, Sr, Ca and Mg; R stands for at least one element selected from the group consisting of Sc, Y, La, Ce, Pr, Nd, Sm, Eu, Gd, Tb, Dy, Go, Er, Tm, Yb and Lu; M stands for at least one metal selected from the group of copper, silver and gold, and O stands for oxygen.

6. A circuit board according to claim 5, wherein the superconducting ceramic pattern contains 0.4 to 1.0 parts by weight of at least one of the titanium and silicon coupling agents.

7. A circuit board according to claim 1, wherein the superconducting ceramic pattern is a multilayer structure carrying a plurality of interconnection films.

8. A superconducting circuit board, comprising:
a sintered alumina board containing more than 99% by weight of alumina; and
a superconducting ceramic pattern formed on the alumina board the superconducting ceramic pattern is made of a superconducting oxide represented by the general formula:

where $M^{II}$ is at least one element selected from the group of Ba, Sr, Ca and Mg; $M^{III}$ is at least one element selected from the group of Y, Sc, La, Ce, Pr, Nd, Sm, Eu, Gd, Tb, Dy, Ho, Er, Tm, Yb and Lu; $0.5 \leq x \leq 0.9$; $1 \leq y \leq 2$; $1 \leq z \leq 2$; and δ is a deviation from the stoichiometric amount of oxygen; the superconducting oxide exhibiting superconductivity at the temperature of liquid nitrogen.

9. A substrate according to claim 8, wherein the sintered alumina board does not contain more than 0.5% by weight of a composition including at least one of a vitreous component and an amorphous component.

10. A circuit board according to claim 8, wherein the sintered alumina board contains more than 99.7% by weight of alumina and less than 0.3% of at least one of MgO and $Cr_2O_3$.

11. A circuit board according to claim 8, wherein the superconducting ceramic pattern is made of a superconducting ceramics of Bi-Sr-Ca-Cu-O or Tl-Bi-Sr-Ca-Cu-O system.

12. A superconducting circuit board comprising:
a sintered alumina board contains more than 99% by weight of alumina;
a superconducting ceramic pattern formed on the alumina board, the superconducting ceramic pattern containing 100 parts by weight of a superconducting ceramics and 0.1 to 10 parts by weight of at least one of titanium and silicon oxide compounds the superconducting ceramic pattern is made of a superconducting oxide represented by the general formula:

where $M^{II}$ is at least one element selected from the group of Ba, Sr, Ca and Mg; $M^{III}$ is at least one element selected from the group of Y, Sc La, Ce, Pr, Nd, Sm, Eu, Gd, Tb, Dy, Ho, Er, Tm, Yb and Lu; $0.5 \leq x \leq 0.9$; $1 \leq y \leq 2$; $1 \leq z \leq 2$; and δ is a deviation from the stoichiometric amount of oxygen; the superconducting oxide exhibiting superconductivity at the temperature of liquid nitrogen.

13. A circuit board according to claim 11, wherein the superconducting ceramic pattern contains 0.4 to 1.0 parts by weight of at least one of the titanium and silicon coupling agents.

14. A circuit board according to claim 8, wherein the superconducting ceramic pattern is a multilayer structure carrying a plurality of interconnection films.

* * * * *

UNITED STATES PATENT AND TRADEMARK OFFICE
CERTIFICATE OF CORRECTION

PATENT NO. : 5,081,070

DATED : January 14, 1992

INVENTOR(S) : Hiromitsu Yokoyama, Yoshihiko Imanaka, Kazunori Yamanaka, Nobuo Kamehara, Koichi Niwa, Takuya Uzumaki, Hitoshi Suzuki, and Takato Machi It is certified that error appears in the above-identified patent and that said Letters Patent is hereby corrected as shown below:

Column 1, line 13, delete "7".

Column 2, line 36, "Bi-Sr-Ca-Cu-0" should be --Bi-Sr-Ca-Cu-O-- (the alphabet "O").

Column 5, line 39, "for" should be --form--.

Column 7, line 10, "$0.5 \leq 0.9$," should be --$0.5 \leq x \leq 0.9$,--;
line 24, after "composition" insert --$(Y_{0.6}Ba_{0.4})_2 CuO\delta$.--;
line 55, after "EXAMPLE 4" delete "(".

Signed and Sealed this

Twelfth Day of May, 1992

Attest:

DOUGLAS B. COMER

Attesting Officer      Acting Commissioner of Patents and Trademarks